United States Patent [19]
Swamy et al.

[11] Patent Number: 5,593,322
[45] Date of Patent: Jan. 14, 1997

[54] LEADLESS HIGH DENSITY CONNECTOR

[75] Inventors: Deepak Swamy; Victor Pecone, both of Austin, Tex.

[73] Assignee: Dell USA, L.P., Austin, Tex.

[21] Appl. No.: 375,328

[22] Filed: Jan. 17, 1995

[51] Int. Cl.$^6$ ................................................ H01R 23/00
[52] U.S. Cl. .......................... 439/660; 439/83; 439/931
[58] Field of Search ........................... 439/83, 660, 931, 439/931.1, 86, 876

[56]  References Cited

U.S. PATENT DOCUMENTS 5,330,372  7/1994  Pope et al. ............................... 439/931

FOREIGN PATENT DOCUMENTS 0138996    6/1991  Japan ........................................ 439/83
404250684  9/1992  Japan ........................................ 439/83
406275926  9/1994  Japan ........................................ 439/83

*Primary Examiner*—Neil Abrams
*Assistant Examiner*—Eugene G. Byrd
*Attorney, Agent, or Firm*—Stanford & Bennett, L.L.P.; Gary R. Stanford

[57]  ABSTRACT

A leadless high density connector including a plurality of connector pins each having multiconductor pins electrically connected to solder balls on the back side of the connector for interconnection to a PWB. The solder balls form a ball grid array (BGA), which replaces thin gull wing leads used on connectors of prior art. The use of BGA technology as applied to high density connectors provides a plurality of benefits associated with BGA technology. The signal carrying capacity of the connector is increased since the bottom surface of the connector is available for interconnecting signal paths rather than being limited to the peripheral edges as common for leaded packages. The resulting profile of the connector is substantially reduced allowing increased component and wiring density. The resulting bond strength using BGA technology is greater than that with a leaded equivalent due to the increased bond surface area and resulting anchoring effect. Therefore, BGA technology allows significantly increased yields over connectors using leads as known in prior art. The electrical characteristics of a connector according to the present invention is substantially improved since the inductance per pin is reduced using BGA as compared to leads. In this manner, connectors according to the present invention are more suitable for high speed applications especially when combined with the ability to interleave ground and signal connections.

19 Claims, 4 Drawing Sheets

LEADLESS HIGH DENSITY CONNECTOR

FIELD OF THE INVENTION

The present invention relates to high density connectors, and more particularly to leadless connectors having multiconductor pins for mounting to printed wiring boards.

DESCRIPTION OF THE RELATED ART

Electronic devices including computer systems typically require high density connectors for electrically connecting various components of the system. Surface mount technology (SMT) connectors using gull wing leads and multiconductor pins are known and typically used for high density connector applications. Such high density connectors typically include a nonconductive body made of plastic material or the like with a plurality of plastic pins integrally mounted on one side. Each pin includes multiple isolated conductor strips brazed onto the nonconductive connector pin and then soldered to individual interconnect pads for electrical conduction. In this manner, each pin includes a plurality of isolated conductors for connecting a corresponding plurality of electrical signals. The conductive material is typically made of cooper plated with nickel or gold to achieve the desired conductive characteristics. Corresponding female connectors are also known having multiple actuators to form independent isolated paths when connected with the corresponding male connector. The conductors are routed through the plastic body to the opposite side of the connector and then electrically connected to gull wing leads for mounting to a printed wiring board (PWB) using conventional SMT equipment and processes.

Such high density SMT connectors using gull wing leads are a significant improvement over single pin conductors, but still impose routing and placement restrictions as well as several other electrical and mechanical limitations on PWB designers. FIGS. 1A and 1B illustrate an example of an SMT connector using gull wing leads as known in the art. The leads must be aligned along the edges of the connector body thus limiting the maximum signal capacity of the connector. Designers have attempted to resolve this problem by using very fine leads to increase capacity. However, such fine leads are susceptible to a variety of forces causing misalignment, which further leads to coplanarity problems. The solder joints using standard SMT techniques have a rather low level of resilience and thus are highly susceptible to accidental sheer forces that are typically present due to the small surface area of each solder joint. The small surface area combined with fine leads result in relatively low bond strength of the chip to the PWB. Therefore, conventional SMT equipment and processes associated with gull wing leads result in reliability problems. For example, the connector is either misaligned or not properly bonded to the PWB resulting in a marginal or malfunctional board. Such problems decrease the yield of PWBs using conventional SMT techniques.

As shown in FIG. 1B, the use of gull wing leads increases the profile of the connector on the PWB thereby consuming valuable space. Space considerations are becoming more critical as computer systems decrease in size while increasing in speed and functionality. The increased profile consumes valuable PWB space which could otherwise be used for mounting a greater number of components or routing more traces. Furthermore, the lead length of gull wing leads increases the electrical inductance imposed between adjacent or nearby conductors thereby limiting the speed or frequency at which the connector may be operated. Increased impedance causes crosstalk problems as frequency increases, especially when adjacent pins switch simultaneously.

Therefore, it is desired to provide high density connectors using multiconductor pins while increasing the capacity and reliability of the connectors. It is further desired to improve the electrical and mechanical characteristics associated with such high density connectors.

SUMMARY OF THE INVENTION

A high density connector according to the present invention includes a plurality of multiconductor pins on one side of the connector electrically coupled to a corresponding solder balls of a ball grid array (BGA) on the opposite side for interconnection to the PWB. Each multiconductor pin has multiple isolated conductors brazed onto each connector pin and then electrically connected through plated-through holes or conductive vias to individual interconnect pads spread out along the bottom surface of the connector body. Solder balls are then attached or mounted to the interconnect pads forming a BGA. The interconnect pads and solder balls are electrically isolated from other pads and solder balls with solder mask. Thus, each pin includes a multiple number of conductors, preferably at least four or more, for high density applications. The solder ball array on the opposite side of the connector replaces the gull wing leads typically used on high density connectors thereby eliminating most of the problems and limitations associated with thin leads and incorporating the advantages of BGA technology. Corresponding female connectors are also provided with a similar BGA solder ball array on the opposite side of the connector.

Ball grid arrays are similar to pin grid arrays (PGAs) with solder balls replacing pins to permit surface mounting. BGA technology was developed and introduced by International Business Machines Corp. and includes a number of benefits, including small size, better yields, improved electrical performance and lower profile, among other benefits. For more information on BGA technology, please see "IBM details its ball-grid array push," *Electronic Engineering Times*, Aug. 9, 1993 and "Ball grid arrays: the hot new package," *Electronic Engineering Times*, Mar. 14, 1993, both of which are hereby incorporated by reference. A high density connector including BGA technology allows increased capacity since the contacts are spread over the bottom surface of the connector rather than being jammed along the edges. This further decreases the profile of the connector thereby providing more space for conductive traces and other components. The connector is attached to a PWB using conventional infrared (IR) reflow methods to a corresponding array of interconnect pads on the PWB. Each conductor is terminated on the backside of the connector attached to the PWB using a solder ball deposited via reflow. This provides the advantages of BGA technology such as self-centering during reflow process and vastly improved bond strength as compared to the leaded equivalent due to increased bond surface area and the resulting anchoring effect. When the solder balls melt, the surface tension of the solder pulls it into the smallest possible shape, thereby aligning both sides. This results in significant advantages over fine pitch SMT using gull wing leads from both process yield and also from cost standpoints.

Furthermore, a high density connector according to the present invention has improved electrical characteristics. Each pin conductor may carry signals or may alternatively be interleaved with ground connections and signals in applications requiring controlled impedance connectors. The reduction in lead length reduces the lead inductance and thus allows a connector according to the present invention to be used for high speed applications, especially when combined with interleaved signal and ground signals. A high density connector according to the present invention allows increased density of the connectors over prior art connectors using leads without an increase in the complexity of the PWB layout or component placement. At the same time, connectors according to the present invention offer high yields and compatibility with conventional SMT equipment and processes.

It is therefore appreciated that a high density connector according to the present invention has improved electrical and mechanical characteristics as compared to SMT connectors using fine pitch leads according to prior art. The techniques according to the present invention are compatible with conventional SMT equipment and processes but also allow for improvements beyond that which conventional technology can provide.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1A:
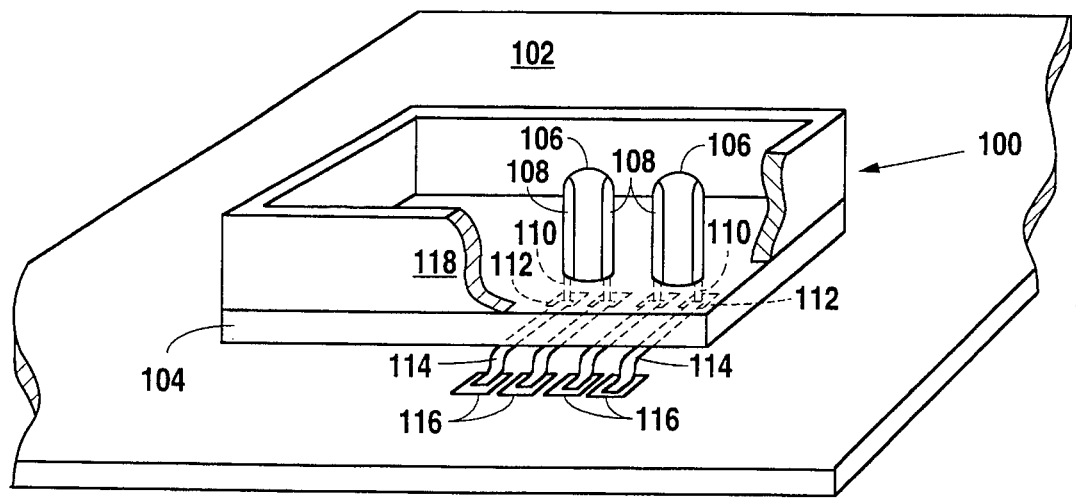
FIG. 1A is a partially cut-away perspective view of a high density connector using gull wing leads according to prior art mounted to a printed wiring board.

Referring now of FIG. 1, a perspective view is shown of an eight-pin connector 100 with multiconductor pins according to prior art mounted to a printed wiring board (PWB) 102. The connector 100 generally includes a plastic body 104 with a plurality of plastic pins 106 mounted on its top side. Only two of the eight pins 106 are shown for purposes of clarity. Each of the pins 106 includes a plurality of isolated conductive strips 108 brazed onto the respective connector pins. The conductive strips 108 are typically made of copper and plated with nickel or gold as known to those skilled in art. Each of the conductive strips 108 are electrically coupled to plated-through holes or conductive vias 110 for providing electrical connection to corresponding connection points or pads 112 on the bottom side of the connector 100. As known to those skilled in the art, gull wing leads 114 are mounted to the conductive pads 112 of the connector 100, where the gull wing leads 114 are aligned along the side edges of the connector 100 as shown in FIG. 1A. Thus, each pin 106 is associated with two of the leads 114 resulting in a 16 lead package. Pursuant to conventional SMT equipment and processes, each of the gull wing leads 114 are then electrically bonded to corresponding conductive pads 116 provided along the top surface of the PWB 102. Plastic walls 118 are integrally mounted with the plastic body 104 of the connector 100 or providing mechanical support when the male connector 100 is mounted with its female counterpart.

Figure 1B:
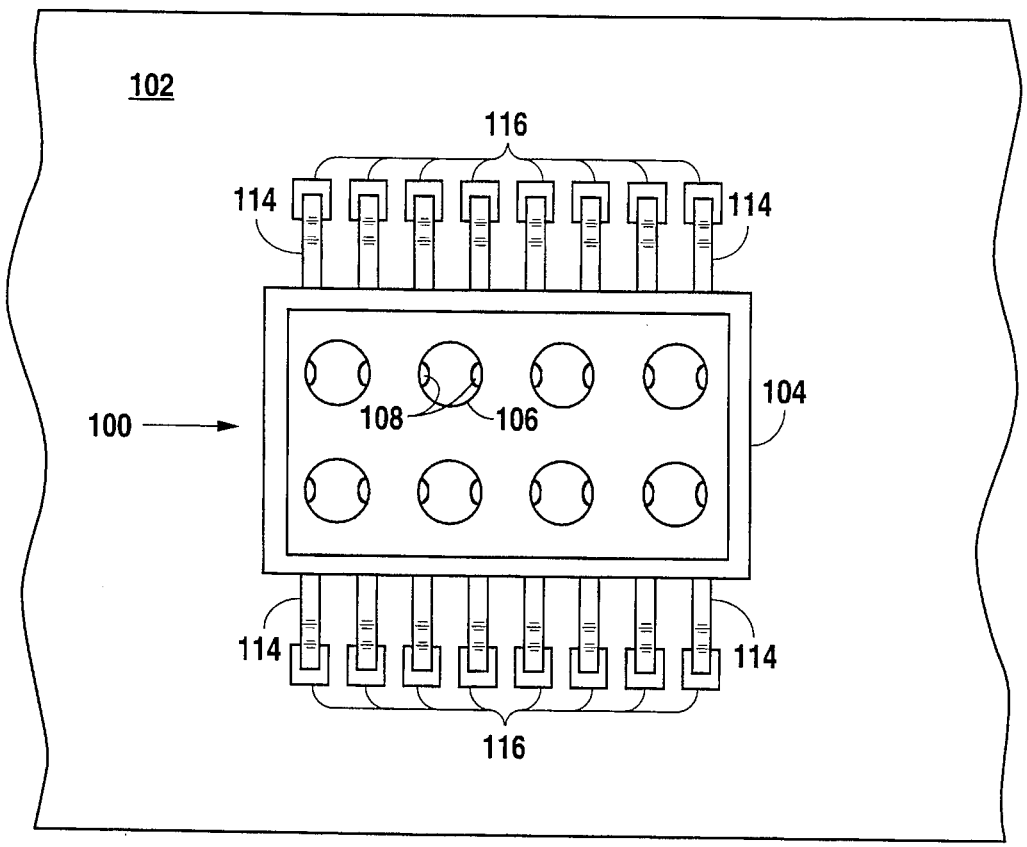
FIG. 1B is a top view of FIG. 1A.

FIG. 1B is a top view of the connector 100 mounted to the PWB 102. As shown, the profile or PWB area of the connector 100 according to prior art is extended beyond the periphery of the body 104 by the leads 114 and the pads 116. This increased profile reduces the area available for mounting other components or for routing traces on the PWB 102. PWB designers are thus forced to route around the pads 116. Higher density connectors are possible with more pins and where each pin may include more than two conductors. However, higher density packages require a higher number of leads 114 along the side edges of the connector 100 posing significant electrical and mechanical problems to PWB designers. The leads 114 must be made significantly thinner to accommodate a greater number of along the perimeter of the connector 100. The fine leads cause coplanarity problems on higher density packages since the resultant solder joints do not have a high level of resilience to accidental shear forces due to the small surface area of the solder joint. This leads to coplanarity problems or misalignment of the leads 114 with the pads 116 as well as decreased bond strength of each of the leads 114 bonded to the corresponding pads 116. Such coplanarity problems and decreased bond strength results in reliability problems with connectors according to prior art. The resulting yield of PWBs with such prior art connectors mounted thereon is relatively low since the connector leads are either not properly electrically connected to the PWB or such connections are often easily broken when the PWB 102 is subjected to strain and stress forces.

Furthermore, there are a plurality of electrical problems associated with the use of thin leads such as the leads 114. The lead length increases the inductance resulting in a limited frequency of operation of the connector 100. This problem is made worse when signals interjected along adjacent leads switch at the same time causing crosstalk problems and potential electrical signal errors.

Figure 2B:
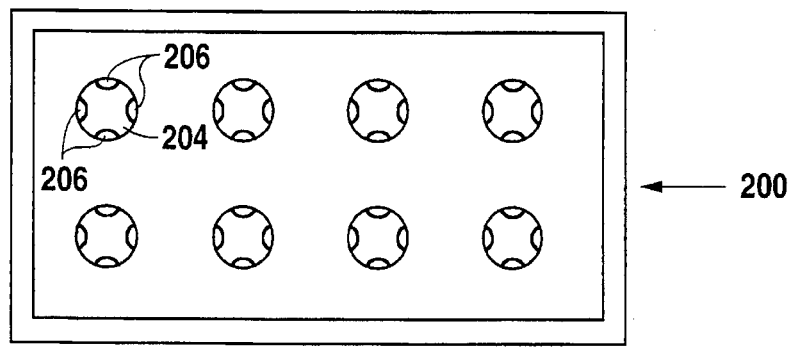
FIG. 2B is a top view of the connector shown in FIG. 2A.
Figure 2A:
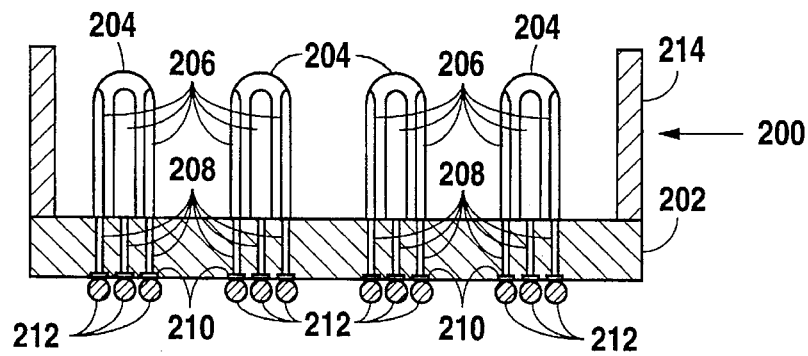
FIG. 2A is a cross-sectional side view of a leadless high density connector according to the present invention.

Referring now to FIG. 2A, a side view is shown of a leadless high density connector 200 implemented according to the present invention. Although a package with only eight pins is shown, larger packages are contemplated with increased pin count. For example, connectors having 25, 32, 64, 128 etc. pins are contemplated. As shown, the connector 200 includes a body 202 which is preferably made of a nonconductive material such as plastic or the like. A plurality of nonconductive pins 204 are integrally mounted to the body 202, where each pin 204 has multiple, isolated conductive strips 206 which are typically made of cooper and plated with nickel or gold and brazed onto the corresponding pins 204. As shown, each pin 204 includes four electrically isolated conductive strips 206, although each pin 204 may include up to 8 or more independent conductive strips 206 as desired. Thus, the eight-pin connector 200 has the capacity to handle up to 32 electrically independent signals.

Each of the conductive strips 206 for each pin 204 are electrically coupled through plated-through holes or conductive vias 208 penetrating the body 204 to the bottom side of the connector 200 for electrical contact with conductive pads 210 on the bottom side of the connector 200. Furthermore, a solder ball 212 is attached to corresponding ones of the pads 210. The solder balls 212 form a ball grid array (BGA) along the bottom surface of the connector 200, as more clearly shown in FIG. 2C. The solder balls 212 replace leads such as the leads 114 shown in FIG. 1A to permit surface mounting to a PWB. The use of BGA technology allows increased electrical signal capacity since the entire bottom surface of the connector 200 is available for electrical connections rather than being limited to the peripheral edges of the body of the connector. Plastic side walls 214 are preferably integrally mounted to the body 202 to facilitate mechanical support when coupled to a corresponding female connector.

Figure 2C:
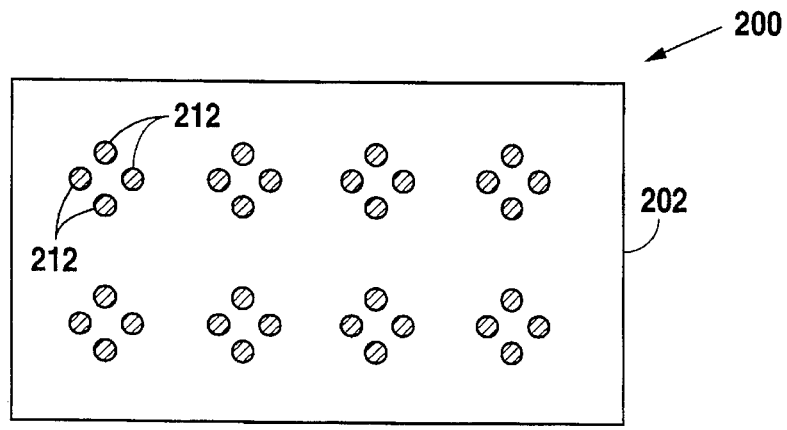
FIG. 2C is a bottom view of the connector shown in FIG. 2A.

FIG. 2B illustrates a top view of the connector 200 clearly showing four independent conductive strips 206 brazed upon each of the connector pins 204. Of course, any number of conductive strips 206 may be brazed upon the individual pins 204 to achieve the desired density of the connector 200. FIG. 2C is a bottom view of the connector 200 illustrating the 32 connection BGA formed by the 32 solder balls 212. In this manner, the four conductive strips 206 are electrically coupled to individual solder balls 212 in groups of four as shown in FIG. 2C. Solder mask is placed between and around the pads 210 and the solder balls 212 along the bottom surface of the connector 200 to avoid undesired electrical contact between signals during solder reflow when the connector 200 is mounted to a PWB. FIG. 2c clearly illustrates the increased signal capacity of the connector 200.

Figure 3A:
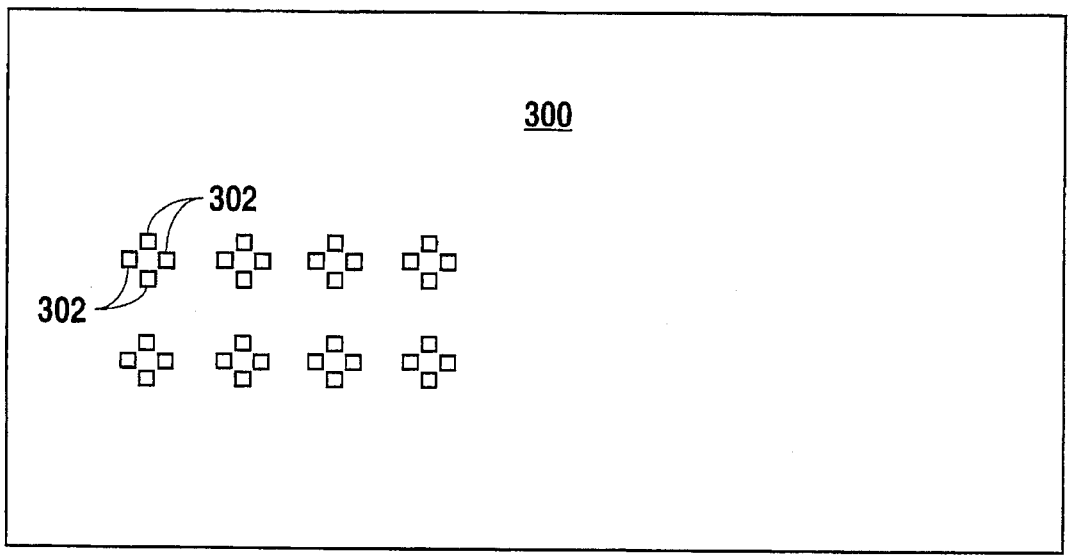
FIG. 3A is a top view of a PWB having interconnect pads for connecting to the solder balls of the connector of FIG. 2A.
Figure 3B:
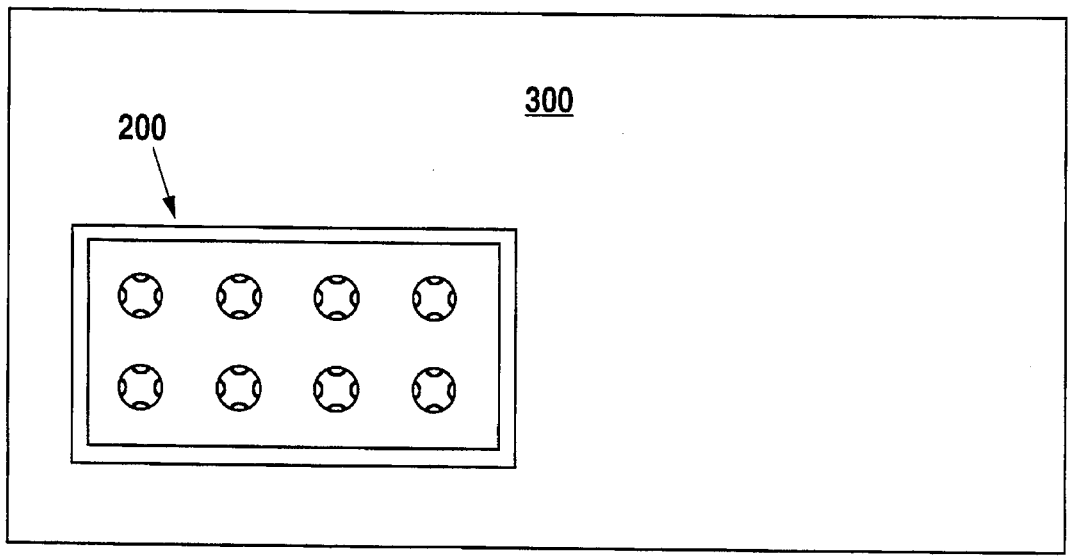
FIG. 3B is top view of the connector of FIG. 2A mounted to the PWB of FIG. 3A.

FIG. 3A is a top view of a PWB 300 including conductive pads 302 spaced and aligned for connection with the solder balls 212 of the connector 200. FIG. 3B is a top view of the connector 200 mounted to the PWB 300, illustrating that the connector 200 consumes less space on the PWB 300 as compared to the connector 100 mounted on the PWB 102 shown in FIG. 1B, while also having at least the same or substantially greater amount of electrical signal capacity. In particular, the leads 114 and the conductive pads 116 are replaced by the pads 302 located underneath the connector 200 for electrical connection to the solder balls 212 of the BGA rather than being placed about the periphery of the connector. This increases the space available on the PWB 300 for mounting components and routing conductive traces. Furthermore, the yields of BGA technology are much higher than packages using thin leads. First, the solder balls 212 are significantly more rugged than the thin leads 114 and less susceptible to physical forces potentially causing misalignment of the leads 114. Therefore, coplanarity problems are substantially reduced using BGA technology. Further, electrical connection to the corresponding pads 302 on the PWB 300 is further enhanced by self-alignment during reflow of the solder. When the solder melts, the surface tension of the solder pulls it into the smallest shape possible causing alignment of the connector 200 on the PWB 300. The result in bond strength using BGA technology is substantially greater than that with a leaded equivalent due to increased bond surface area and resulting anchoring effect. Therefore, the connector 200 bonded to the PWB 300 is better aligned and less susceptible to physical forces than the connector 100 mounted to the PWB 102.

Furthermore, the connector 200 using BGA technology eliminates the use of the leads 114 thereby resulting in low inductance of each of the electrical connections. In particular, the solder balls 212 have significantly reduced inductance as compared to the leads 114 which provides a key benefit reducing crosstalk potential between adjacent electrical signals when compared to the leaded equivalent shown in FIGS. 1A, 1B. Therefore, the connector 200 may be operated at a higher frequency with reduced risk of crosstalk among adjacent pins. The connector 200 is attached to the PWB 300 using conventional infrared (IR) reflow methods. The reduced lead length decreases lead inductance and thus makes the connector 200 more suitable for high speed applications as compared to the connector 100. The reliability of the connector 200 is further enhanced if each of the conductive traces are alternatively interleaved with ground connections for applications which require controlled impedance connectors. In all cases, each conductor is terminated on the back side of the connector 200 to a solder ball that is deposited in reflow or by any one of the known means using known equipment and processes as known to those familiar with conventional SMT processes and techniques.

Figure 4A:
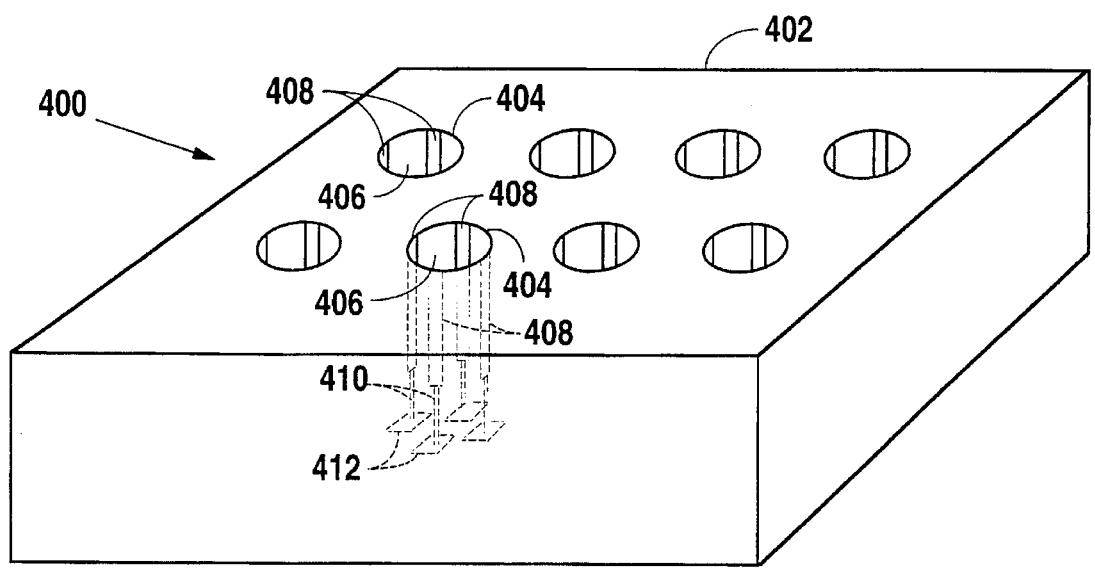
FIG. 4A is a perspective view of a female version of the connector of FIG. 2A according to the present invention.
Figure 4B:
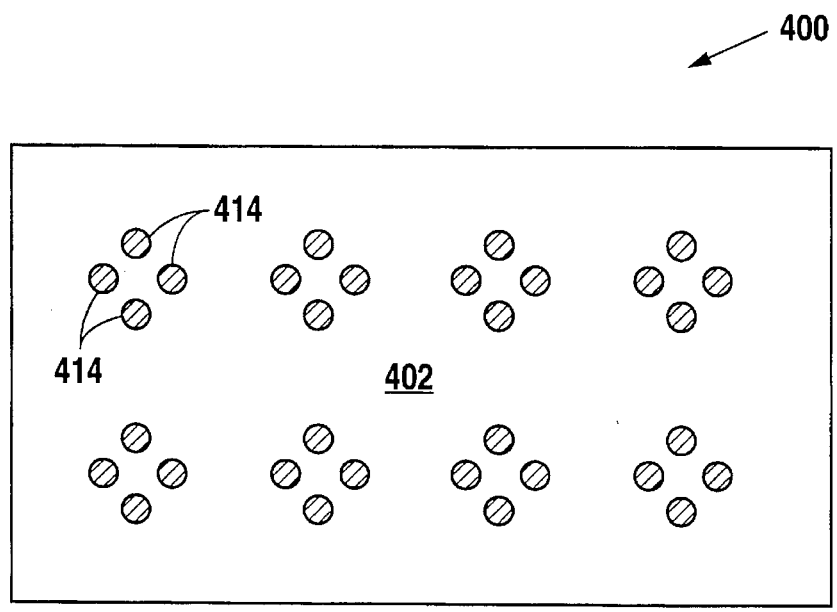
FIG. 4B is a bottom view of the connector of FIG. 4A.

FIG. 4A is a perspective view of a female connector 400 compatible with the male connector 200. The connector 400 includes a nonconductive body 402 with a plurality of corresponding cavities 404 for receiving corresponding male pins, such as the pins 204 of the connector 200. The surface or walls 406 of each of the cavities 404 are brazed with a plurality of conductive strips 408 in a similar fashion as the conductive strips 206 mounted on the individual pins 204. In particular, the conductive strips 408 are positioned to corresponding conductive strips on the corresponding male connector for achieving a one-to-one electrical signal contact. The conductive strips are electrically coupled through plated-through holes or vias 410 to conductive pads 412 in a similar manner as described for the connector 200. FIG. 4B is a bottom view of the connector 400 illustrating the BGA and individual solder balls 414 of the BGA. Each of the solder balls 414 are attached to corresponding ones of the pads 412, in a similar manner as described above for the connector 200. As described previously, the number of pins and the number of electrical conductors per pin may be decreased or increased as desired depending upon the desired capacity of the connector 400. The connector 400 is mounted to a PWB such as the PWB 300 shown in FIG. 3A in a similar manner as described above for the connector 200.

It can now be appreciated that a leadless high density connector according to the present invention provides substantial improvements over high density connectors of prior art. Each of the conductive strips on the individual connector pins are mounted through conductive means to corresponding solder balls on the bottom of the connector, where the solder balls are aligned according to BGA technology and techniques. The BGA allows connection with corresponding conductive pads along the surface of a PWB, using convention IR reflow methods or the like. The use of BGA technology as applied to connectors provides all the added advantages of BGA such as self-centering during reflow process as compared to fine pitch SMT as well as increased bond strength. The resultant bond strength is greater than that with a leaded equivalent due to the increased bond surface area and the resulting anchoring effect. This results in significantly higher yields as compared to connectors of prior art. Furthermore, the resulting profile of a connector according to the present invention is substantially reduced as compared to that of prior art allowing increased component and wiring density. Therefore, a conductor according to the present invention is more suitable for high speed applications especially when combined with the ability to interleave signal and ground connections.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A high density connector, comprising:
   a connector body having top and bottom surfaces including a plurality of non-conductive connector pins integrally mounted on said top surface of said connector;
   a plurality of conductive traces brazed on each of said plurality of connector pins;
   a plurality of solder balls forming a ball grid array on said bottom surface of said connector body; and
   a plurality of conductors for electrically coupling each of said plurality of conductive traces to corresponding ones of said plurality of solder balls.

2. The high density connector of claim 1, wherein said connector body and pins are made of plastic.

3. The high density connector of claim 1, wherein said conductive traces are made of copper.

4. The high density connector of claim 3, wherein said conductive traces are plated with a conductive material.

5. The high density connector of claim 3, wherein said conductive material is nickel or gold.

6. The high density connector of claim 1, wherein each of said plurality of conductors includes conductive vias.

7. The high density connector of claim 1, wherein said plurality of conductors include conductive pads attached along said bottom surface of said connector body, each of said conductive pads for receiving a corresponding one of said plurality of solder balls.

8. The high density connector of claim 1, further comprising:
   solder mask provided along said bottom surface of said connector body between and around said solder balls.

9. The high density connector of claim 1, wherein there are at least four of said conductive traces brazed upon each of said connector pins.

10. A high density connector, comprising:
    a connector body having top and bottom surfaces including a plurality of sockets formed along said top surface and penetrating within said connector body, said sockets including socket walls;
    a plurality of independent conductive traces brazed along said socket walls of each of said plurality of sockets;
    a plurality of solder balls forming a ball grid array on said bottom surface of said connector body; and
    a plurality of conductors for electrically coupling each of said plurality of conductive traces to corresponding ones of said plurality of solder balls.

11. The high density connector of claim 10, wherein said connector body is made of plastic.

12. The high density connector of claim 10, wherein said conductive traces comprise copper.

13. The high density connector of claim 12, wherein said conductive traces are further plated with a conductive material.

14. The high density connector of claim 10, wherein said plurality of conductors includes conductive vias.

15. The high density connector of claim 10, wherein said plurality of conductors include conductive pads provided along said bottom surface of said connector body, each of said conductive pads for receiving a corresponding one of said plurality of solder balls.

16. The high density connector of claim 10, further comprising:
    solder mask provided along said bottom surface of said connector body between and around said solder balls.

17. The high density connector of claim 10, wherein there are at least four of said conductive traces for each of said plurality of sockets.

18. A printed wiring board having a surface, comprising:
    an array of conductive pads mounted along the surface of the printed wiring board;
    a high density connector implemented with a ball grid array for interconnecting said connector to said array of conductive pads attached to the printed wiring board using surface mount technology, said connector comprising:
    a connector body having top and bottom surfaces including a plurality of non-conductive connector pins integrally mounted on a top surface of said connector;
    a plurality of conductive traces brazed on each of said plurality of connector pins;
    a plurality of conductive vias for electrically coupling each of said plurality of conductive traces to corresponding ones of said arrays of conductive pads; and
    a plurality of reflowed solder pads for electrically interconnecting and mechanically attaching said conductive vias to corresponding ones of said array of conductive pads.

19. The printed wiring board of claim 18, wherein said array of conductive pads includes at least four pads for each of said plurality of connector pins of said high density connector.

* * * * *